(12) United States Patent
Qi et al.

(10) Patent No.: US 9,129,807 B2
(45) Date of Patent: Sep. 8, 2015

(54) GROWTH REACTOR SYSTEMS AND METHODS FOR LOW-TEMPERATURE SYNTHESIS OF NANOWIRES

(71) Applicant: PALO ALTO RESEARCH CENTER INCORPORATED, Palo Alto, CA (US)

(72) Inventors: Pengfei Qi, Palo Alto, CA (US); William S. Wong, San Carlos, CA (US)

(73) Assignee: Palo Alto Research Center Incorporated, Palo Alto, CA (US)

( * ) Notice: Subject to any disclaimer, the term of this patent is extended or adjusted under 35 U.S.C. 154(b) by 0 days.

(21) Appl. No.: 14/081,464

(22) Filed: Nov. 15, 2013

(65) Prior Publication Data

US 2014/0073117 A1  Mar. 13, 2014

Related U.S. Application Data

(62) Division of application No. 12/022,563, filed on Jan. 30, 2008, now Pat. No. 8,603,246.

(51) Int. Cl.
| | |
|---|---|
| *H01L 21/02* | (2006.01) |
| *B01J 7/00* | (2006.01) |
| *B01J 15/00* | (2006.01) |
| *B01J 19/24* | (2006.01) |
| *B82Y 40/00* | (2011.01) |

(52) U.S. Cl.
CPC ............. *H01L 21/02603* (2013.01); *B01J 7/00* (2013.01); *B01J 15/005* (2013.01); *B01J 19/2415* (2013.01); *H01L 21/0237* (2013.01); *H01L 21/0262* (2013.01); *H01L 21/02532* (2013.01); *B01J 2219/00135* (2013.01); *B82Y 40/00* (2013.01); *Y10S 118/00* (2013.01)

(58) Field of Classification Search
None
See application file for complete search history.

(56) References Cited

U.S. PATENT DOCUMENTS

| | | |
|---|---|---|
| 5,443,648 A | 8/1995 | Ohkase |
| 5,603,772 A | 2/1997 | Ide |
| 6,241,822 B1 | 6/2001 | Ide |
| 6,706,963 B2 | 3/2004 | Gaudiana et al. |
| 6,761,871 B2 | 7/2004 | Little |
| 6,793,734 B2 | 9/2004 | Takagi |
| 7,553,371 B2 | 6/2009 | Dubrow et al. |
| 7,670,431 B2 | 3/2010 | Miyahara et al. |
| 7,758,928 B2 | 7/2010 | Bunce et al. |

(Continued)

OTHER PUBLICATIONS

Park NanoLetters 2011 V11 p. 740.*

(Continued)

*Primary Examiner* — Joseph Miller, Jr.
(74) *Attorney, Agent, or Firm* — Bever, Hoffman & Harms, LLP (57) ABSTRACT

A method for synthesis of silicon nanowires provides a growth reactor having a decomposition zone and a deposition zone. A precursor gas introduced into the decomposition zone is disassociated to form an activated species that reacts with catalyst materials located in the deposition zone to deposit nano-structured materials on a low melting point temperature substrate in the deposition zone. A decomposition temperature in the decomposition zone is greater than a melting point temperature of the low melting point temperature substrate. The silicon nanowire are grown directly on the low melting point temperature substrate in the deposition zone to prevent the higher temperatures in the decomposition zone from damaging the molecular structure and/or integrity of the lower melting point temperature substrate located in the deposition zone.

13 Claims, 7 Drawing Sheets

(56) References Cited

U.S. PATENT DOCUMENTS

| | | |
|---|---|---|
| 8,122,850 B2 | 2/2012 | Hishiya et al. |
| 2002/0130311 A1 | 9/2002 | Lieber et al. |
| 2002/0175408 A1 | 11/2002 | Majumdar et al. |
| 2003/0039602 A1* | 2/2003 | Sharma et al. ............... 423/349 |
| 2004/0005723 A1* | 1/2004 | Empedocles et al. ............. 438/1 |
| 2005/0029678 A1 | 2/2005 | Hanrath et al. |
| 2005/0061249 A1 | 3/2005 | Miyahara et al. |
| 2005/0176228 A1* | 8/2005 | Fonash et al. ............... 438/597 |
| 2005/0253137 A1 | 11/2005 | Whang |
| 2006/0019472 A1* | 1/2006 | Pan et al. ..................... 438/486 |
| 2006/0247122 A1 | 11/2006 | Hampden-Smith et al. |
| 2007/0092431 A1 | 4/2007 | Resasco et al. |
| 2007/0111493 A1 | 5/2007 | Lee et al. |
| 2007/0238314 A1 | 10/2007 | Buretea et al. |
| 2007/0281156 A1 | 12/2007 | Lieber et al. |
| 2008/0081439 A1* | 4/2008 | Coffer ........................... 438/468 |
| 2008/0248304 A1 | 10/2008 | Hanrath et al. |
| 2009/0026421 A1 | 1/2009 | Li et al. |
| 2009/0075468 A1 | 3/2009 | Buretea et al. |
| 2010/0308338 A1 | 12/2010 | Bet et al. |
| 2010/0323500 A1 | 12/2010 | Buretea et al. |

OTHER PUBLICATIONS

S. Kodambaka et al., "Germanium Nanowire Growth Below the Eutectic Temperature", Science 316, (2007), pp. 729-731.

A. Colli et al., "Synthesis and Optical Properties of Silicon Nanowires Grown by Different Methods", Appl. Phys. A 85, (2006), pp. 247-253.

D. Wang et al., "Germanium Nanowire Field-Effect Transistors with $SiO_2$ and high-k $HfO_2$ Gate Dielectrics", Applied Physics Letters, vol. 83, No. 12 (2003), pp. 2432-2434.

M. Sunkara et al., "Bulk Synthesis of Silicon Nanowires Using a Low-Temperature Vapor-Liquid-Solid Method", Applied Physics Letters, vol. 79, No. 10, (2001), pp. 1546-1548.

S. Hofmann et al., "Gold Catalyzed Growth of Silicon Nanowires by Plasma Enhanced Chemical Vapor Deposition", Journal of Applied Physics, vol. 94, No. 9, (2003), pp. 6005-6012.

* cited by examiner

GROWTH REACTOR SYSTEMS AND METHODS FOR LOW-TEMPERATURE SYNTHESIS OF NANOWIRES

This is a Division of application Ser. No. 12/022,563 filed Jan. 30, 2008. The disclosure of the prior application is hereby incorporated by reference herein in its entirety.

BACKGROUND

Described herein are growth reactor systems and methods for low-temperature synthesis of nanowires and nano-structured materials. The low-temperature synthesis of the nanowires and nano-structured materials may be accomplished at low temperatures. The nanowires and nano-structured materials may be directly integrated or grown onto a low melting point temperature substrate without melting the substrate.

The nanowires and nano-structured materials may be used to link nano-sized electronic components into nano-sized circuits. In embodiments, the nanowires and nano-structured materials may be used to complement or replace carbon nanotubes. In embodiments, the low melting point substrate having the nanowires integrated therein may be used in flexible electronics applications and the like.

REFERENCES

Various methods for synthesis of nanowires from a precursor gas and catalyst materials have been proposed for silicon (Si) nanowires. These various methods have provided improvements in synthesizing Si nanowires with an activated species of the precursor gas and catalyst materials at a temperature from about 450° C. to about 700° C. The growth of the Si nanowires from these various methods also occurs within a range of the eutectic temperatures of the precursor species and the catalyst materials.

For example, Si nanowires grown using $SiH_4$ as the precursor gas and gold catalyst materials have an eutectic temperature or growth temperature of about 460° C. Low melting point temperature substrates, such as polymeric-based substrates, often have a melting temperature that is below the eutectic temperature of the precursor gas and the catalyst materials, for example of about 300° C. or less. Because the Si nanowires are grown at a temperature substantially greater than the melting temperature of the low melting point temperature substrates, formation of the Si nanowires on the low melting point temperature substrates has required multiple step processing. For example, the Si nanowires are first grown on a high melting point temperature growth substrate, that is, a substrate able to withstand the higher deposition temperatures of about 450° C., and up. Then, the Si nanowires are transferred onto the low melting point temperature substrate. This multiple step processing to integrate the Si nanowires onto the low melting point temperature substrate is time consuming and often costly.

While current nanowires synthesis methods are acceptable for the purpose of growing Si nanowires to be integrated onto the low melting point temperature substrates via the multiple step processing, it is still desired to provide growth reactor systems and methods for low-temperature synthesis of nanowires for direct deposit or growth onto a low melting point temperature substrate.

SUMMARY

In embodiments, disclosed is a system for synthesis of silicon nanowires that includes a growth reactor having a decomposition zone and a deposition zone located downstream from the decomposition zone, wherein a decomposition temperature of the decomposition zone is greater than a deposition temperature of the deposition zone. Further, the system may include a substrate located within the deposition zone, wherein the substrate has a melting point temperature that is greater than the deposition temperature of the deposition zone. Moreover, the system may include catalyst materials deposited onto the substrate to form a growth area and activated species generated in the decomposition zone being carried to and located in the deposition zone, wherein the activated species is generated in the decomposition zone by decomposing a precursor gas, and wherein the activated species and the catalyst materials react within the deposition zone and form nano-structured materials within the growth area.

Also disclosed is a method for synthesis of silicon nanowires on a substrate in a growth reactor having a decomposition zone and a deposition zone, wherein a decomposition temperature of the decomposition zone is greater than a deposition temperature of the deposition zone, feeding a precursor gas into the decomposition zone. The method may include dissociating the precursor gas in the decomposition zone to form an activated species, feeding the activated species to the deposition zone and reacting the activated species with catalyst materials located in the deposition zone to deposit nano-structured materials on a substrate in the deposition zone, wherein the decomposition temperature in the decomposition zone is greater than about 350° C. and the deposition temperature in the deposition zone is less than about 325° C.

In further embodiments, disclosed is a method for synthesis of silicon nanowires on a substrate in a growth reactor having a decomposition zone at a decomposition temperature and a deposition zone at a deposition temperature. The method may include dissociating precursor gas located in the decomposition zone to form an activated species, wherein the decomposition temperature of the decomposition zone is greater than a decomposition temperature of the precursor gas and feeding the activated species to the deposition zone. Moreover, the method may include positioning the substrate within the deposition zone of the growth reactor and reacting the activated species with catalyst materials located in the deposition zone to deposit nano-structured materials on the substrate, wherein the deposition temperature in the deposition zone is less than the eutectic temperatures of the precursor gas and the catalyst materials.

The improved growth reactor system and methods for low-temperature synthesis of nanowires avoid the problems involved with the multiple step integration processing by preventing exposure of the low-temperature substrate to the higher temperatures required for dissociating the precursor gas to form the activated species.

EMBODIMENTS

The present disclosure relates generally to growth reactor systems and methods for low-temperature synthesis of nanostructured materials to form silicon nano-sized wires and/or rods (hereinafter "nanowires"). The growth reactor for low-temperature synthesis of the nanowires may have at least two different zones with distinct temperature profiles in the zones. A decomposition zone of the growth reactor may be heated to a decomposition temperature that dissociates or decomposes a precursor gas to form an activated species from the precursor gas. The activated species is then transported downstream of the decomposition zone into a deposition zone at a deposition temperature. The decomposition temperature for decomposing the precursor gas is greater than the deposition temperature of the deposition zone for growing the nanowires.

By forming the activated species from a precursor gas at the decomposition temperature in the decomposition zone, and then flowing the activated species from the decomposition zone to the deposition zone that is at a lower temperature than the decomposition zone, the nanowire is able to be formed at a lower temperature. Separating the precursor gas decomposition zone and deposition zone allows growth of the nanowire to be achieved at temperatures below the eutectic temperatures of the precursor gas and the catalyst materials. As a result, the nanowire may be grown and integrated directly onto substrates having a low melting point temperature. By using a low-temperature synthesis of the nano-structured materials, the nanowires may be directly integrated or grown on the substrate without damaging or melting of the substrate.

The term "low melting point temperature" refers to, for example, a polymeric-based substrate that has a melting point that is less than the decomposition temperature of the decomposition zone, for example a melting point that is about 350° C. or less, such as from about 200° C. to about 350° C.

The term "low-temperature synthesis" refers to, for example, a multiple zone synthesis process for nanowires where a precursor gas is cracked in a high temperature zone to form activated species, the activated species being used to form the silicon nanowires in a subsequent low temperature zone. The low temperature zone has a temperature lower than the melting point temperature of the low melting point temperature substrate.

The term "nanosized" refers to, for example, average particle sizes of from about 1 nm to about 1,000 nm. For example, the nano-sized particles forming the nanowires may have a size of from about 1 nm to about 250 nm, from about 5 nm to about 150 nm, from about 5 nm to about 100 nm or from about 5 nm to about 75 nm.

The term "nanowire" refers to a wire having a diameter of the order of a nanometer. In embodiments, the term "nanowire" may refer to a quantum wire or a structure that has a lateral size constrained to tens of nanometers or less and an unconstrained longitudinal size. For example, the nanowire may have lateral size from about 1 nm to about 250 nm, from about 5 nm to about 150 nm, from about 5 nm to about 100 nm or from about 5 nm to about 75 nm.

In embodiments, the precursor gas for forming the activated species may include a Si precursor gas, such as $SiH_4$ gas and the like. The precursor gas may decompose into the activated species at a decomposition temperature. For example, the Si precursor gas may be cracked to form activated Si species that may subsequently react with catalyst material in a deposition zone. As a result, the activated Si species may form nano-sized Si particles in the deposition zone. The decomposition temperature for the precursor gas may be a temperature that is greater than the melting point temperature of the substrate. In embodiments, the decomposition temperature for the precursor gas may be at least about 300° C., such as at least about 350° C., about 375° C. or about 400° C., such as from about 350° C. to about 700° C., from about 375° C. to about 600° C. or from about 380° C. to about 500° C.

The low melting point temperature substrate for integration of the nanowires thereon may be made from any suitable polymer, for example including polyimide and the like. The substrate may have a melting point temperature that is less than the decomposition temperature of the precursor gas, but greater than the decomposition temperature described below. In embodiments, the substrate may have a melting point temperature that is less than about 350° C., such as from about 200° C. to about 350° C., including less than about 325° C. or less than about 300° C.

Catalyst materials may be used to react with the activated species of the precursor gas to grow the nano-structured materials at a location adjacent to the catalyst materials. The catalyst materials are thus desirably present in the deposition zone, and desirably upon the substrate. The activated species reacts with the catalyst materials to form the nano-structured materials. As the activated species reacts with the catalyst materials, the nano-structured materials are deposited at the location to form one or more nanowires at the location adjacent to the catalyst materials.

Catalyst materials with average diameters less than about 100 nm may be effective for growth of the nanowires. Catalyst materials having average diameters less than about 100 nm, such as less than 60 nm, may increase diffusion of the activated species into the nanowire to be more efficient because the diffusion distance may be smaller based on the average diameter of the catalyst materials.

The average diameter of the catalyst materials may control the growth of the nanowires at low temperatures in the deposition zone. The nanowires are effectively grown in the deposition zone when catalyst materials have an average diameter of less than about 100 nm are reacted with the activated species. The nanowires are effectively grown because reacting the activated species with catalyst materials with an average diameter of less than about 100 nm allows diffusion of the activated species to be more efficient since the diffusion distance between the activated species and the catalyst materials is smaller.

Suitable catalyst materials may include particles of Au, Pt, Ni and/or titanium (Ti). In embodiments, the catalyst materials may be nano-sized particles. The catalyst materials may be direct pattern deposited onto the substrate to identify and define a growth area for deposition and growth of the nanostructured materials from reacting the activated species and catalyst materials. By direct pattern depositing the catalyst materials to define the growth area for the synthesis of the nanowires on the substrate and reacting the activated species with the use of a catalyst materials on the substrate, the nanowires may be directly grown or synthesized onto the substrate at the growth area by the catalyst materials and the activated species.

In embodiments, the density and/or length of the nanowires grown at low temperatures may depend on the deposition temperature of the deposition zone where the nanowires may be grown and/or may depend on the average diameter of the catalyst materials used for synthesis of the nanowires. The optimal average diameter of the catalyst materials and/or the optimal deposition temperature of the deposition zone may be selected to control the density and length of the nanowires synthesized in the deposition zone.

The catalyst materials may be directly pattern deposited onto the substrate by a pattern depositing method, such as photolithography or jet printing. In embodiments, the catalyst materials may be spun on or drop casted onto the substrate. In embodiments, a stamp method or silicon stamp may deposit the catalyst materials onto the substrate. In embodiments, the catalyst materials may be dissolved into a solution which is applied to the substrate. The solution is subjected to evaporation so that the catalyst materials remain on the substrate to define the growth area for the synthesis of the nanowires. In embodiments, a probe tip may deposit the catalyst materials onto the substrate.

The pattern depositing method may include a block co-polymer blend that may pattern the catalyst materials via one or more holes. A block co-polymer blend may be spun cast onto the substrate. As a result, the blend material may self assemble into a host matrix with an embedded nanoscale phase separated polymer. A selective etchant may remove the phase separated polymer and a remaining matrix can be used as a template or a mask for patterning nano-scale pores or holes. As a result, the catalyst materials may be deposited into the pores or holes, and the nanowires may be grown directly in the pores or holes. The block co-polymer may be chosen such that the melting temperature may be greater than the temperature in the deposition zone.

The growth reactor for the low-temperature synthesis of nanowires includes at least two temperature zones to grow the nanowires. The growth reactor has the decomposition zone heated to and/or maintained at the decomposition temperature, and the deposition zone heated to and/or maintained at the deposition temperature. In embodiments, the growth reactor may have an optional intermediate zone interposed between the decomposition zone and the deposition zone that may be heated to and/or maintained at an intermediate temperature. The optional intermediate zone and the deposition zone are downstream from the decomposition zone. The optional intermediate zone may separate the decomposition zone from the deposition zone, and permit the temperature of the activated species to go down for use in the deposition zone.

The temperature in the decomposition zone is greater than the temperature in the optional intermediate zone and the temperature in the deposition zone. The temperature in the optional intermediate zone may be greater than the temperature in the deposition zone and may be less than the temperate in the decomposition zone. The temperature in the deposition zone may be less than the temperature in the decomposition zone and the temperature in the optional intermediate zone.

The temperature in the decomposition zone may be greater than about 350° C. or about 400° C., such as about 350° C. to about 700° C., from about 375° C. to about 600° C. or from about 380° C. to about 500° C. The temperature in the deposition zone may be less than about 350° C., such as from about 200° C. to about 350° C., including less than about 325° or less than about 300° C. The decomposition and deposition zones of the growth reactor may be individually heated by separate furnaces or may be heated with a single furnace.

The growth of the nanowires in deposition zone may depend on the temperature in the deposition zone. A higher temperature in the deposition zone, such as 350° C., increases growth of the nanowires in the deposition zone. As the temperature in the deposition zone decrease, the efficiency of growing nanowires in the deposition zone may decrease and/or be suppressed. For example, at temperatures below 200° C. in the deposition zone, growth of the nanowires in the deposition zone may be suppressed.

In embodiments with the optional intermediate zone, the temperature of the optional intermediate zone may be in a range from about 275° C. to about 400° C. or from about 325° C. to about 375° C. The intermediate temperature may be less than the decomposition temperature such that the activated species may be cooled during transfer between the decomposition zone and the deposition zone. The optional intermediate zone may be separately heated from or heated in conjunction with the decomposition and deposition zones. In embodiments, the optional intermediate zone may not be heated and the temperature in the optional intermediate zone may occur from the introduction of the activated species being transferred from the decomposition zone to the deposition zone.

The decomposition, optional intermediate and/or deposition zones may be directly heated by resistive heating of a volume surrounding one or more of the zones or by radiative heating of the substrate. Alternatively, the decomposition, optional intermediate and/or deposition zones may be indirectly heated by inductively couple heating of a substrate on a susceptor adjacent to one or more of the zones.

The precursor gas may enter or flow into the growth reactor at the decomposition zone upstream from the deposition zone and the optional intermediate zone. The precursor gas may flow from the decomposition zone through the optional intermediate zone and into the deposition zone. The substrate may be located downstream from the decomposition zone and the optional intermediate zone and/or in the deposition zone for synthesis and integration of the nanowires onto the substrate.

A carrier gas may be introduced into the decomposition zone to assist with flow from the decomposition zone to the deposition zone. The carrier gas may flow from the decomposition zone to the deposition zone and may carry the activated species with the carrier gas from the decomposition zone to the deposition zone. In embodiments, the carrier gas for the activated species may be $H_2$, He or Ar.

When the precursor gas enters the decomposition zone, the temperature in the decomposition zone is sufficient to dissociate or decompose the precursor gas to form the activated species and a non-active species. The activated species formed by dissociating or decomposing the precursor gas is reactive with the catalyst materials in the deposition zone, allowing the growth of the nanowires on the substrate.

For example, $SiH_4$ precursor gas may flow into the decomposition zone. The temperature in the decomposition zone dissociates the $SiH_4$ precursor gas into Si activated species and $H_2$ non-activated species. The Si activated species and/or the $H_2$ non-activated species flow from the decomposition zone into the optional intermediate zone and/or the deposition zone. The Si activated species may be reactive with the catalyst materials to grow Si nanowires.

The activated species may flow downstream to the deposition zone and may cause growth of the nanowires onto the substrate in the deposition zone via reacting the activated species with the catalyst materials. The activated species reacts with the catalyst materials and forms nano-sized rods and/or wires on the substrate in the deposition zone. In embodiments, the non-active species, such as H, may remain in the gas phase and may be pumped from the growth reactor system.

By decomposing the precursor gas in the decomposition zone to form the activated species and transferring the activated species to the deposition zone, the nano-structured materials and the nanowires may be grown on the substrate in the deposition zone at a deposition temperature that is lower than the melting point temperature of the substrate and/or less than eutectic temperatures of the activated gas and/or catalyst materials. As a result, the nano-structured materials and the nanowires may be synthesized downstream from the high temperature decomposition zone and in the low-temperature deposition zone to prevent the decomposition temperature from melting and/or damaging the substrate.

In embodiments, a silane activated species may react with the catalyst materials for growing Si nano-structured materials or Si nanowires at temperatures less than about 350° C., such as from about 200° C. to about 350° C., including less than about 325° or less than about 300° C.

Further, forming the activated species in the decomposition zone and growing the nanowires at the deposition temperature in the deposition zone allows the nanowires to be synthesized at a low temperature without use of an additional heating source, such as plasma, laser irradiation and the like. Moreover, the nanowires may be synthesized at the low temperature in the deposition zone without use of a liquid interface and/or low melting catalyst materials, such as Ga catalyst materials and the like.

For shutdown of the growth reactor with resistive heating, and thus completion of the deposition of the nanowires, the separate furnaces or the single furnaces that heat one or more zones of the growth reactor may be shut off. Further, the flow of precursor gas into the growth reactor may be shut off, while the flow of carrier gas may or may not be maintained. The growth reactor may cool for a duration of time, such as more than about 10 minutes, including about 20 minutes or about 30 minutes. The growth reactor chamber may be flushed with an inert gas, such as Ar gas or the like. After the growth reactor is cooled, the flow of inert gas may be terminated. As a result, the reaction in the deposition zone between the activated species and the catalyst materials and the synthesis of the nanowires onto the substrate in the deposition zone is completed. In embodiments, when radiative heating is used to heat one or more zones, the temperature may abruptly be changed to shutdown the growth reactor by reducing light intensity directed towards the substrate. However, radiative heating of the substrate may not provide sufficient heat coupling between the light and precursor gas.

Figure 1:
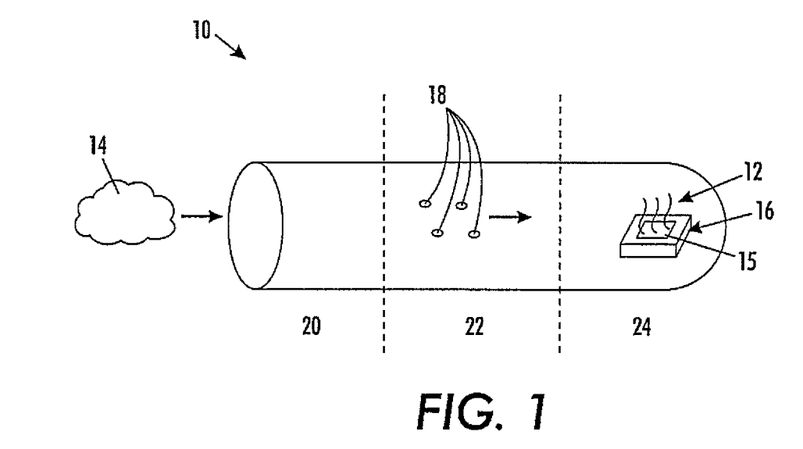
FIG. 1 illustrates a schematic of a multiple temperature zone reactor for low-temperature Si nanowire growth.

In embodiments and as shown in FIG. 1, the growth reactor 10 for growing silicon nanowires may include at least two zones having different temperatures, such as the decomposing zone 20 heated to and/or maintained at the decomposition temperature and a deposition zone 24 heated to and/or maintained at a deposition temperature. As shown in FIG. 1, the growth reactor 20 may have an optional intermediate zone 22 heated to and/or maintained at the intermediate temperature.

The growth reactor 10 synthesizes the silicon nanowires 12 with catalyst materials and precursor gas 14 at a growth area 15 on a substrate 16. The growth area 15 may be formed by the catalyst materials deposited onto the substrate 16. The precursor gas 14 may enter the growth reactor 10 via the decomposition zone 20. The substrate 16 may be located in the deposition zone 24.

The precursor gas 14 may be decomposed in the decomposition zone 20 by the decomposition temperature therein. As a result, activated species 18 of the precursor gas 14 may be formed and carried into the optional intermediate zone 22 and the deposition zone 24. The activated species 18 may cool while being carried to the deposition zone 24. The activated species 18 may react with the catalyst materials at the growth area 15 on the substrate 16. As a result, the silicon nanowires 12 may grow at growth area 15 on the substrate 16 from the activated species 18 and the catalyst materials.

The following Examples are submitted to illustrate embodiments of the present disclosure.

Example 1

In an example growth reactor, a decomposition temperature of the decomposition zone of the growth reactor is about 450° C., the intermediate temperature of the optional intermediate zone is about 375° C., and the deposition temperature of the deposition zone is about 300° C. The substrate is located in the center of the deposition zone. A $SiH_4$ precursor gas and $H_2$ gas is introduced into the decomposition zone of the growth reactor at a gas flow rate of about 20 standard cubic centimeters per minute (sccm) $SiH_4$ gas and about 80 sccm $H_2$ gas with a chamber pressure of about 100 torr.

A growth reactor is flushed with about 100 sccm $H_2$ gas and about 500 sccm Ar gas for about 20 minutes. The growth reactor is next flushed with only 100 sccm $H_2$ gas with furnaces heating the decomposition zone to about 450° C., the optional intermediate zone to about 375° C. and the deposition zone to about 300° C. in about 10 minutes or until the temperatures of the zones are stabilized.

After the temperature for the zones of the growth reactor are stabilized, about 20 sccm $SiH_4$ gas and about 80 sccm $H_2$ gas flow into the reactor is begun and continued for about 30 minutes. As the $SiH_4$ gas is introduced into the first zone, dissociation of the $SiH_4$ gas begins as the $SiH_4$ gas is heated above the dissociation temperature of the $SiH_4$ gas in the first zone.

After the $SiH_4$ gas is dissociated, the Si activated species flows from the decomposition zone, through the optional intermediate zone and into the deposition zone where the substrate is located. The Si precursor species in the third zone reacts with gold (Au) colloid catalyst materials therein and begins synthesis of Si nano-structured materials and Si nanowires onto the substrate. As a result, the Si nanowires grow on the substrate and are thus integrated on the substrate.

In embodiments, the activated species may be heated to a temperature of about 450° C. to about 400° C. in the optional intermediate zone. Moreover, the activated species may be heated to a temperature of, for example, about 400° C. to about 350° C. in the deposition zone.

For shutdown, the furnace is shut off and the flow of $SiH_4$ gas is into the growth reactor is shut off, while the flow of $H_2$ gas is maintained at 100 sccm for about 10 minutes. The growth reactor is allowed to cool for about 30 minutes, while flushing with about 500 sccm Ar gas. After the growth reactor is cooled and the flow of Ar gas is terminated, the reaction between the Si precursor species and the gold catalyst materials and the synthesis of the Si nanowires onto the substrate is complete.

The nanowires may be directly deposited and integrated onto the substrate in the deposition zone without exposing the substrate to the high-temperature required by the decomposition zone for decomposing the $SiH_4$ precursor gas. As a result, high-performance materials, such as the nanowires may be integrated into low-cost flexible platforms such as the substrate. By directly patterning the catalyst materials onto a desired location, synthesis and growth of the nanowires may be controlled to align and register the nanowires onto the desired location of the substrate. Additionally, the lower synthesis temperatures in the deposition zone may minimize diffusion of the catalyst materials into the nanowires. Moreover, use of the direct patterned the catalyst materials may allow growth and synthesis of the nanowires into patterned arrays and/or aligned arrays on the substrate.

Example 2

Figure 2:
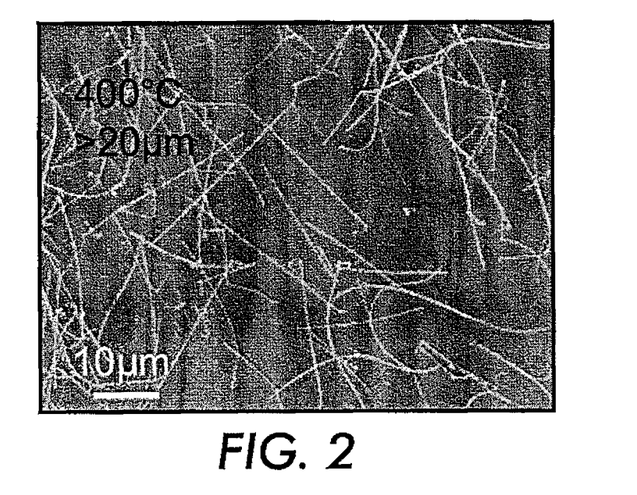
FIG. 2 illustrates a micrograph of Si nanowire growth for 60 nm diameter Au colloids at a growth temperature of 400° C.
Figure 3:
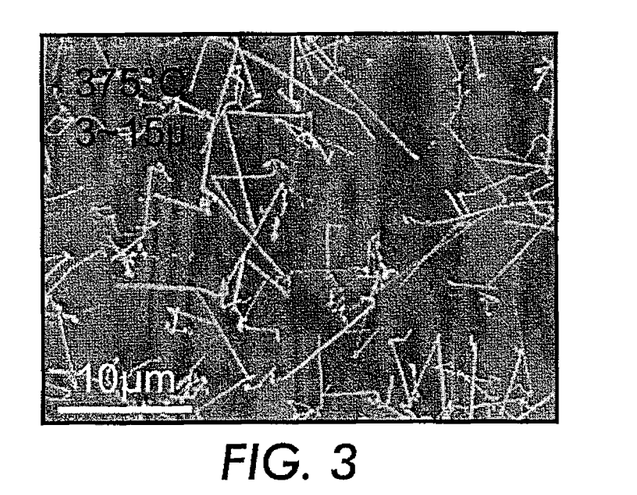
FIG. 3 illustrates a micrograph of Si nanowire growth for 60 nm diameter Au colloids at a growth temperature of 375° C.
Figure 4:
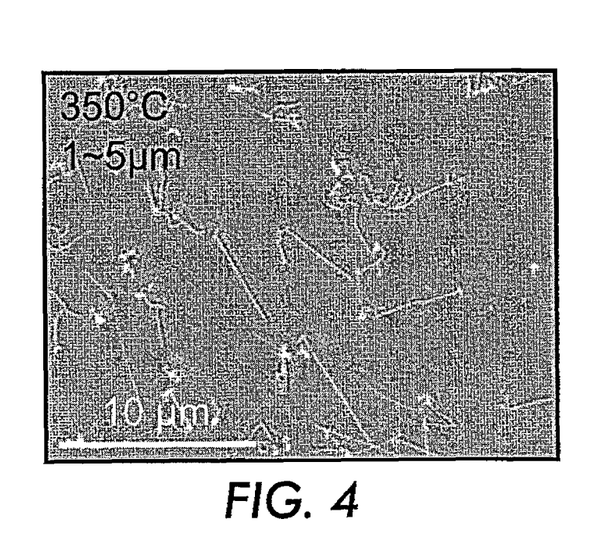
FIG. 4 illustrates a micrograph of Si nanowire growth for 60 nm diameter Au colloids at a growth temperature of 350° C.
Figure 5:
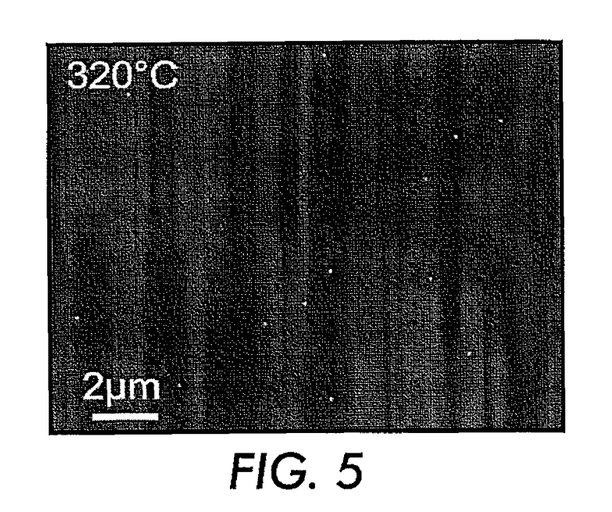
FIG. 5 illustrates a micrograph of Si nanowire growth for 60 nm diameter Au colloids at a growth temperature of 320° C.

The same process used to grow the Si nanowires in Example 1 may be used to grow Si nanowires, except the temperature in the decomposition zone is about 450° C. and the average diameter of the catalyst materials is about 60 nm. When the temperature in the deposition zone is about 400° C., the length of the synthesized Si nanowires may be greater than about 20 µm as shown in FIG. 2. When the temperature in the deposition zone is about 375° C., the length of the synthesized Si nanowires may be from about 3 µm to about 15 µm as shown in FIG. 3. When the temperature in the deposition zone is about 350° C., the length of the synthesized Si nanowires may be from about 1 µm to about 5 µm as shown in FIG. 4. When the temperature in the deposition zone is below 320° C. and the average diameter of the catalyst materials at about 60 nm, growth of the synthesized Si nanowires is substantially suppressed as shown in FIG. 5.

Example 3

Figure 6:
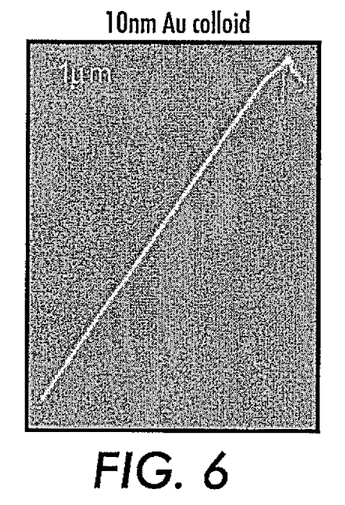
FIG. 6 illustrates a micrograph of Si nanowire growth at a growth temperature of 320° C. for a 10 nm diameter Au colloid.
Figure 7:
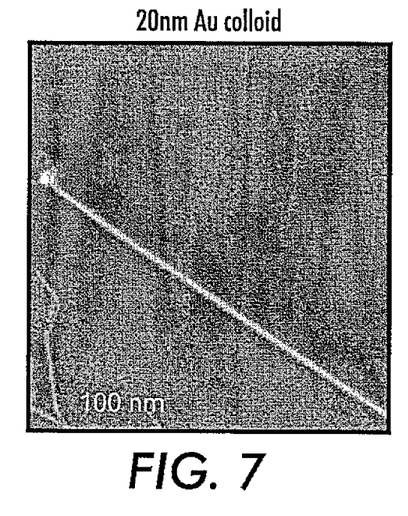
FIG. 7 illustrates a micrograph of Si nanowire growth at a growth temperature of 320° C. for a 20 nm diameter Au colloid.
Figure 8:
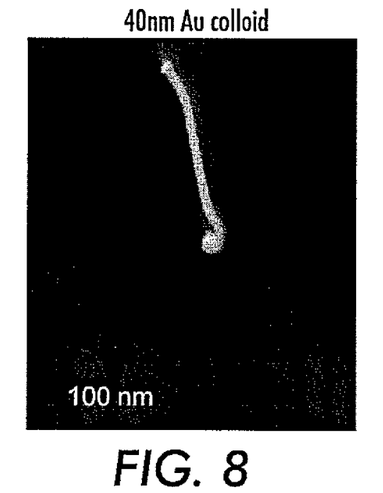
FIG. 8 illustrates a micrograph of Si nanowire growth at a growth temperature of 320° C. for a 40 nm diameter Au colloid.
Figure 9:
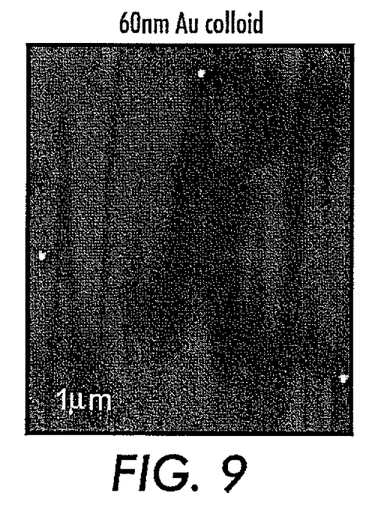
FIG. 9 illustrates a micrograph of Si nanowire growth at a growth temperature of 320° C. for a 60 nm diameter Au colloid.

The same process used to grow the Si nanowires in Examples 1 and 2 may be used to grow Si nanowires, except the temperature in the decomposition zone is about 450° C., the temperature of the deposition zone is about 320° C. and the average diameter of the gold colloid catalyst materials is about 10 nm, 20 nm, 40 nm and 60 nm. When the average diameter of the catalyst materials is about 10 nm, the length of the synthesized Si nanowires may be greater than about 2.5 µm to about 3 µm as shown in FIG. 6. When the average diameter of the catalyst materials is about 20 nm, the length of the synthesized Si nanowires may be greater than about 0.65 to about 0.85 µm as shown in FIG. 7. When the average diameter of the catalyst materials is about 40 nm, the length of the synthesized Si nanowires may be greater than about 0.4 µm to about 0.6 µm as shown in FIG. 8. When the average diameter of the catalyst materials at about 60 nm, growth of the synthesized Si nanowires is substantially suppressed as shown in FIG. 9.

Example 4

Figure 10:
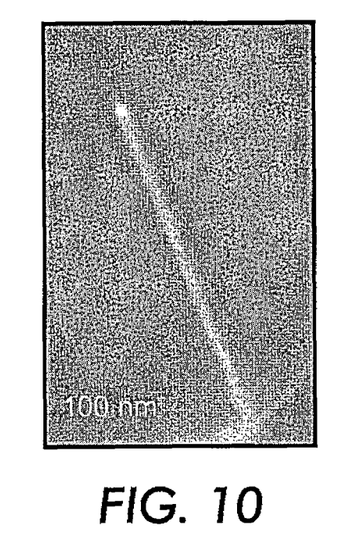
FIG. 10 illustrates a first micrograph of Si nanowire growth at a decomposition temperature of about 450° C. and a growth temperature of 290° C.
Figure 11:
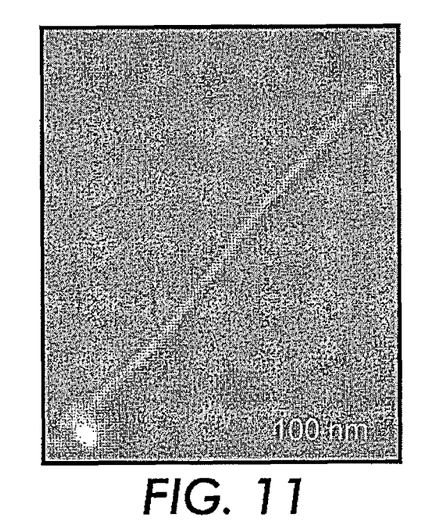
FIG. 11 illustrates a second micrograph of Si nanowire growth at a decomposition temperature of about 450° C. and a growth temperature of 290° C.

The same process used to grow the Si nanowires in Examples 1-3 may be used to grow Si nanowires, except the temperature in the deposition zone is about 290° C. and the temperature in the decomposition zone is about 450° C. As a result, Si nanowires may synthesized in the deposition zone having a length from about 0.2 µm to about 0.6 µm, from about 0.3 µm to about 0.5 µm or greater than about 0.4 µm, as shown in FIGS. 10 and 11.

The length of the synthesized Si nanowires may be dependent upon the average diameter of the catalyst materials used to synthesize the Si nanowires. In embodiments, when the temperature in the deposition zone is about 290° C., the synthesis of Si nanowires may be suppressed except when the average diameter of the catalyst materials is about 10 nm. When the average diameter of the cataystt materials is used, such as 20 µm, the temperature in the deposition zone may have to be above 290° C. to synthesize Si nanowires.

Figure 12:
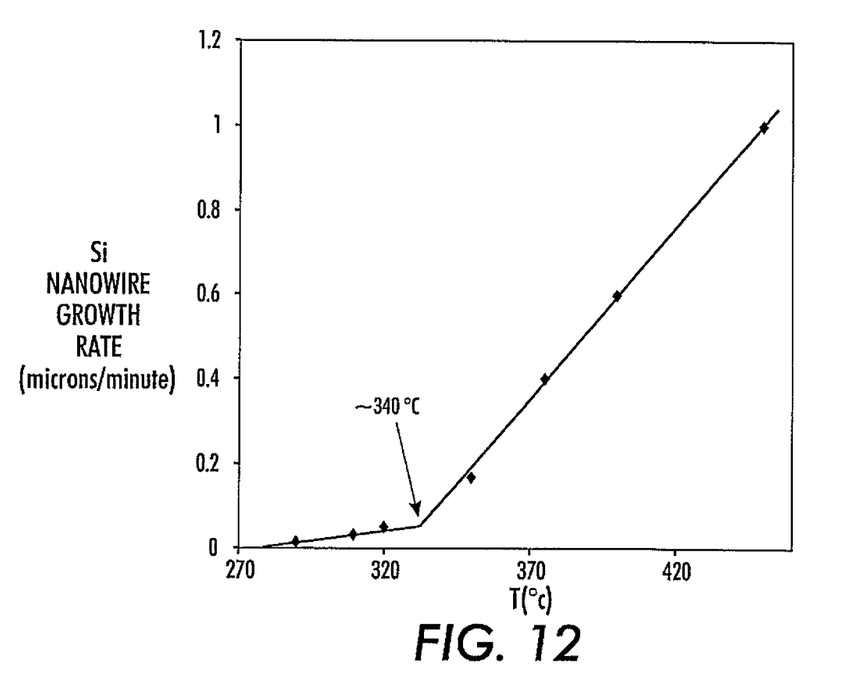
FIG. 12 illustrates a graph of a growth rate of the Si nanowires as a function of temperature in the deposition zone

FIG. 12 illustrates a graph of a growth rate of the Si nanowires as a function of temperature in the deposition zone. In embodiments, the temperature in the deposition zone may be above 340° C. and the growth rate of the Si nanowires may be increased because a liquid phase silicon diffusion in the catalyst may occur as shown by the greater slope in the graph of FIG. 12 for temperatures above about 340° C. On the other hand, the temperature in the deposition zone may be below 340° C. and the growth rate of the Si nanowires may be decreased because a solid state diffusion of silicon in the catalyst may occur as shown by the lesser slope in the graph of FIG. 12 from temperatures below about 340° C. to about 270° C.

It will be appreciated that various of the above-disclosed and other features and functions, or alternatives thereof, may be desirably combined into many other different systems or applications. Also, it will be appreciated that various presently unforeseen or unanticipated alternatives, modifications, variations or improvements therein may be subsequently made by those skilled in the art which are also intended to be encompassed by the following claims. Unless specifically recited in a claim, steps or components of claims should not be implied or imported from the specification or any other claims as to any particular order, number, position, size, shape, angle, color, or material.

What is claimed is:

1. A method for synthesizing silicon nanowires comprising:
   feeding a precursor gas into a decomposition zone of a growth reactor;
   dissociating the precursor gas in the decomposition zone to form an activated species, wherein a decomposition temperature of the decomposition zone is greater than about 350° C.;
   feeding the activated species to the deposition zone; and
   reacting the activated species with a catalyst material located in the deposition zone to deposit nano-structured materials on a substrate in the deposition zone,
   wherein the deposition temperature in the deposition zone is less than about 325° C.,
   further comprising:
   after the dissociating and before the feeding the activate species to the deposition zone, feeding the activated species to an intermediate zone of the growth reactor;
   wherein an intermediate temperature of the intermediate zone is less than the decomposition temperature and greater than a deposition temperature of a deposition zone of the growth reactor.

2. The method according to claim 1, wherein:
   the decomposition temperature in the decomposition zone is from about 350° C. to about 900° C.;

the intermediate temperature in the intermediate zone is in a range from about 325° C. to about 400° C.; and the deposition temperature in the deposition zone is from about 250° C. to about 325° C.

3. The method according to claim 1, wherein the substrate is a low melting point temperature substrate.

4. The method according to claim 3, further comprising:

depositing the catalyst material within the deposition zone such that the nano-structured materials are deposited on the low melting point temperature substrate in a patterned array at a growth area.

5. The method according to claim 1, wherein the catalyst material is at least one selected from the group consisting of Au, Pt, Ni and Ti.

6. The method according to claim 1, wherein the precursor gas is SiH.sub.4 gas.

7. The method according to claim 1, further comprising:

feeding a carrier gas with the precursor gas into the decomposition zone, wherein the carrier gas carries the precursor gas from the decomposition zone to the deposition zone.

8. A method for synthesizing silicon nanowires comprising:

dissociating a precursor gas located in a decomposition zone of a growth reactor to form an activated species;

feeding the activated species to an intermediate zone of the growth reactor, wherein an intermediate temperature of the intermediate zone is less than a decomposition temperature in the decomposition zone and greater than a deposition temperature in a deposition zone;

feeding the activated species to a deposition zone of the growth reactor;

positioning a substrate within the deposition zone of the growth reactor; and reacting the activated species with catalyst materials located in the deposition zone to deposit nano-structured materials on the substrate;

wherein a decomposition temperature of the decomposition zone is greater than a decomposition temperature of the precursor gas; and wherein the deposition temperature in the deposition zone is less than the eutectic temperatures of the precursor gas and the catalyst materials.

9. The method according to claim 8, further comprising:

forming a nanowire on the substrate with the nano-structure materials.

10. The method according to claim 8, wherein:

the substrate is a polymeric-based substrate; and the deposition temperature of the deposition zone is greater than a melting point temperature of the substrate.

11. The method according to claim 8, wherein the catalyst material is at least one selected from the group consisting of Au, Pt, Ni and Ti.

12. The method according to claim 8, wherein the precursor gas is $SiH_4$ gas.

13. The method according to claim 8, further comprising:

depositing the catalyst material at within the deposition zone such that the nano-structured materials are deposited in on the substrate in a patterned array at a growth area.

\* \* \* \* \*